United States Patent
Wang et al.

(10) Patent No.: US 11,211,583 B2
(45) Date of Patent: Dec. 28, 2021

(54) ENCAPSULATION STRUCTURE, DISPLAY PANEL AND DISPLAY APPARATUS

(71) Applicant: BOE TECHNOLOGY GROUP CO., LTD., Beijing (CN)

(72) Inventors: Dawei Wang, Beijing (CN); Youwei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 174 days.

(21) Appl. No.: 15/767,292

(22) PCT Filed: Sep. 18, 2017

(86) PCT No.: PCT/CN2017/102121
§ 371 (c)(1),
(2) Date: Apr. 10, 2018

(87) PCT Pub. No.: WO2018/166160
PCT Pub. Date: Sep. 20, 2018

(65) Prior Publication Data
US 2019/0067634 A1    Feb. 28, 2019

(30) Foreign Application Priority Data
Mar. 14, 2017    (CN) .......................... 201720247904.3

(51) Int. Cl.
*H01L 51/52*    (2006.01)
*H01L 27/32*    (2006.01)
*H01L 51/56*    (2006.01)

(52) U.S. Cl.
CPC ...... *H01L 51/5253* (2013.01); *H01L 27/3244* (2013.01); *H01L 51/56* (2013.01);
(Continued)

(58) Field of Classification Search
CPC . H01L 51/5253; H01L 27/3244; H01L 51/56; H01L 2251/558; H01L 2251/303; H01L 2251/301; H05B 33/04
See application file for complete search history.

(56) References Cited

U.S. PATENT DOCUMENTS 8,928,013 B2    1/2015    Matsuda
9,722,206 B2 *  8/2017    Huh .................. H01L 51/5256
(Continued)

FOREIGN PATENT DOCUMENTS

CN    103490019 A    1/2014
CN    103943786 A    7/2014
(Continued)

OTHER PUBLICATIONS

International Search Report issued in International Search Report No. PCT/CN2017/102121, dated Dec. 21, 2017; with English translation.

(Continued)

*Primary Examiner* — Benjamin Tzu-Hung Liu
(74) *Attorney, Agent, or Firm* — McDermott Will and Emery LLP

(57) ABSTRACT

The encapsulation structure includes a first barrier layer and a second barrier layer, and the first barrier layer is located between an object to be encapsulated and the second barrier layer. The display panel includes the encapsulation structure mentioned in the above technical solution. The display apparatus includes the display panel mentioned in the above technical solution.

3 Claims, 2 Drawing Sheets

(52) U.S. Cl.
CPC .. *H01L 2251/301* (2013.01); *H01L 2251/303* (2013.01); *H01L 2251/558* (2013.01)

(56) References Cited

U.S. PATENT DOCUMENTS

| | | | | |
|---|---|---|---|---|
| 2002/0125822 | A1* | 9/2002 | Graff | H01M 50/183 |
| | | | | 313/506 |
| 2005/0263775 | A1 | 12/2005 | Ikeda et al. | |
| 2007/0290201 | A1 | 12/2007 | Hoffmann et al. | |
| 2010/0089636 | A1 | 4/2010 | Ramadas et al. | |
| 2010/0119840 | A1 | 5/2010 | Padiyath et al. | |
| 2010/0194717 | A1* | 8/2010 | Mori | H01L 51/5268 |
| | | | | 345/204 |
| 2014/0225085 | A1* | 8/2014 | Hayashi | H01L 51/0012 |
| | | | | 257/40 |
| 2014/0252342 | A1 | 9/2014 | Ramadas et al. | |
| 2014/0306204 | A1* | 10/2014 | Niu | H01L 51/56 |
| | | | | 257/40 |
| 2015/0014663 | A1* | 1/2015 | Kwak | H01L 21/02126 |
| | | | | 257/40 |
| 2015/0303389 | A1* | 10/2015 | Kim | H01L 51/0097 |
| | | | | 257/40 |
| 2015/0349295 | A1 | 12/2015 | Boesch et al. | |
| 2015/0380683 | A1 | 12/2015 | You | |
| 2016/0108282 | A1 | 4/2016 | Ito | |
| 2016/0225837 | A1* | 8/2016 | Kim | H01L 29/41733 |
| 2016/0322603 | A1* | 11/2016 | Wu | H01L 29/78672 |
| 2017/0084867 | A1* | 3/2017 | Lim | H01L 27/3244 |
| 2018/0095567 | A1* | 4/2018 | Lee | F21V 9/08 |
| 2018/0342674 | A1* | 11/2018 | Nam | C08F 220/18 |

FOREIGN PATENT DOCUMENTS

| | | | |
|---|---|---|---|
| CN | 104039544 A | | 9/2014 |
| CN | 104103660 A | | 10/2014 |
| CN | 104385731 | * | 9/2017 |
| JP | 2002-329720 A | | 11/2002 |
| WO | 2013/062486 A1 | | 5/2013 |

OTHER PUBLICATIONS

Written Opinion of the International Searching Agency issued in International Search Report No. PCT/CN2017/102121, dated Dec. 21, 2017; with English translation.
Extended European Search Report dated Nov. 17, 2020 in corresponding European Application No. 17857647.6.

* cited by examiner

ENCAPSULATION STRUCTURE, DISPLAY PANEL AND DISPLAY APPARATUS

This application is the U.S. National Phase under 35 U.S.C. § 371 of International Patent Application No. PCT/CN2017/102121, filed on Sep. 18, 2017, which in turns claims priority to Chinese Patent Application No. 201720247904.3, filed on Mar. 14, 2017, titled "ENCAPSULATION STRUCTURE, DISPLAY PANEL AND DISPLAY APPARATUS", the entire disclosures of which Applications are incorporated by reference herein.

TECHNICAL FIELD

The present disclosure relates to the technical field of display, more particularly, to an encapsulation structure, a display panel and a display apparatus.

BACKGROUND

With the continuous development of the display technology, the demand for display apparatus by users is constantly increased. A flexible display apparatus overcomes the installation limitation of a traditional display apparatus, and has advantages of light weight, thin thickness, being bendable, wide viewing angle and good advertising effect, and the like. Therefore the flexible display apparatus has been widely used in people's life, such as being used in a curved plane screen and so on. In order to ensure the service life of the flexible display apparatus, the encapsulation technology of the flexible display apparatus is particularly critical.

In the encapsulation structure of the flexible display apparatus of the prior art, there generally occurs a problem that the light extraction efficiency is affected because of the poor leveling effect. In addition, the poor barrier effect to water and oxygen is also a problem generally occurred.

SUMMARY

At first aspect, an encapsulation structure is provided. The encapsulation structure comprises a first barrier layer and a second barrier, and the first barrier layer is located between an object to be encapsulated and the second barrier layer. Wherein, the first barrier layer comprises a first leveling layer configured to improve the leveling property of a surface of the second barrier layer close to the first barrier layer and a first water oxygen barrier layer configured to improve the barrier capability to water and oxygen. The first water oxygen barrier layer is located between the object to be encapsulated and the first leveling layer, and the first leveling layer is located between the first water oxygen barrier layer and the second barrier layer.

In some embodiments, the encapsulation structure further comprises a third barrier layer, and the third barrier layer is located on a surface of the second barrier layer far away from the first barrier layer. The third barrier layer comprises a third leveling layer configured to improve the leveling property of a surface of the second barrier layer close to the third barrier layer and a third water oxygen barrier layer configured to improve the water/oxygen barrier capability, and the third leveling layer is located between the second barrier layer and the third water oxygen barrier layer.

In some embodiments, the encapsulation structure further comprises a third barrier layer, and the third barrier layer is located on a surface of the second barrier layer far away from the first barrier layer. The third barrier layer is a third leveling layer.

In some embodiments, the first water oxygen barrier layer is an aluminum oxide film layer or a silicon nitride film layer; the first leveling layer is a silicon oxynitride film layer; the second barrier layer is an acrylate film layer or an epoxy film layer; and the third leveling layer is a silicon oxynitride film layer.

In some embodiments, the encapsulation structure further comprises a third barrier layer, wherein the third barrier layer is located on a surface of the second barrier layer far away from the first barrier layer; the third barrier layer is a third water oxygen barrier layer.

In some embodiments, a thickness of the first water oxygen barrier layer is 600 nm-700 nm, and a thickness of the first leveling layer is 50 nm-800 nm.

In some embodiments, a thickness of the second barrier layer is 3 μm-10 μm.

In some embodiments, a thickness of the third leveling layer is 600 nm-800 nm.

In some embodiments, a refractive index of the first water oxygen barrier layer is $n_1$, a refractive index of the first leveling layer is $n_2$, a second barrier layer is $n_3$, and $n_1 > n_2 > n_3$.

In some embodiments, a refractive index of the first water oxygen barrier layer is 1.85, a refractive index of the first leveling layer is 1.55, and a refractive index of the second barrier layer is 1.45-1.50.

In some embodiments, the moisture barrier capability of the encapsulation structure is $10^{-5}$ g/(m$^2$·day).

At second aspect, a display panel is provided. The display panel comprises a display substrate and the encapsulation structure stated above in the first aspect, wherein, an object to be encapsulated mentioned in the first aspect is performed as the display substrate.

In some embodiments, the display substrate comprises a substrate and a plurality of thin film transistors formed on the surface of the substrate. A plurality of organic light-emitting devices are formed on an array of the plurality of thin film transistors, and the plurality of thin film transistors are one to one corresponding to the plurality of organic light-emitting devices. Wherein, a signal output end of each of the thin film transistor is connected with the corresponding light emitting device, and the encapsulation structure is formed on the surface of the plurality of light-emitting devices far away from the plurality of thin film transistors.

In some embodiments, the display substrate comprises a substrate and a plurality of thin film transistors formed on the surface of the substrate, a plurality of organic light-emitting devices are formed on an array of the plurality of thin film transistors, and the plurality of thin film transistors are one-to-many corresponding to the plurality of organic light-emitting devices; wherein, a signal output end of each of the thin film transistors is connected with the corresponding light emitting devices, and the encapsulation structure is formed on the surface of the plurality of light-emitting devices far away from the plurality of thin film transistors.

At third aspect, a display apparatus is provided. The display apparatus comprises the flexible display panel stated above in the second aspect.

DESCRIPTION OF THE DRAWINGS

The accompanying drawings described hereinafter are used to provide further understanding of the present disclosure and constitute a portion of the present disclosure. The schematic embodiments of the present disclosure and the description thereof are used to explain the present disclosure, and do not constitute improper limitations to the present disclosure. In the accompanying drawings.

DETAILED DESCRIPTION

In order to further describe the encapsulation structure, the display panel and the display apparatus provided by the embodiments of the present disclosure, a detailed description is made below combining with the accompanying drawings.

An encapsulation structure usually adopts an encapsulation mode in which a first barrier layer, a second barrier layer and a third barrier layer are stacked in sequence. For example, the first barrier layer and the third barrier layer may be a silicon nitride film layer or a silicon oxynitride film layer, and the second barrier layer may be an organic material film layer. When the first barrier layer and the third barrier layer are silicon nitride film layers, the encapsulation structure has a strong barrier capability to water and oxygen (achieving to an order of magnitude of $10^{-5}$ g/(m²·day). In some embodiments of the disclosure, the moisture barrier capability of the encapsulation structure is $10^{-5}$ g/(m²·day). However, the contact between the silicon nitride film layer and the organic material film layer can lead to a poor leveling effect of the surface of the organic material film layer, so that on the surface of the organic material film layer a bad phenomenon of nebulization, voids or Newton rings occurs, then the light extraction efficiency is affected and the display effects of the flexible display apparatus is reduced. When the first barrier layer and the third barrier layer are of a silicon oxynitride film layer, the barrier capability to water and oxygen of the encapsulation structure is reduced because of the poor barrier effect to water oxygen of the silicon oxynitride film layer, even the good leveling effect of the contact surface between the organic material film layer and the silicon oxynitride film layer is improved.

Example 1

Figure 1:
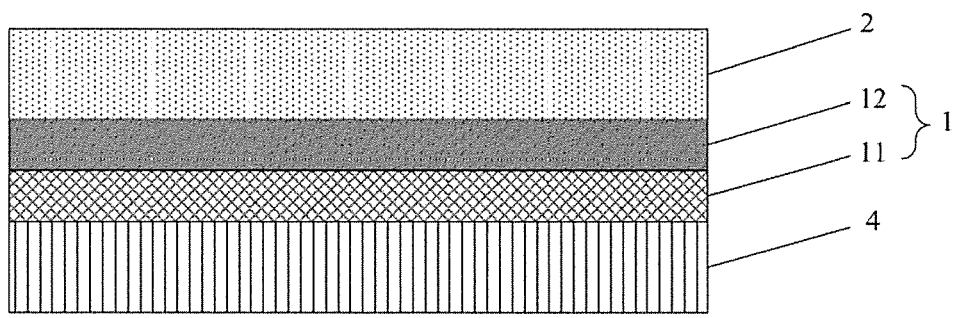
FIG. 1 is a first structural diagram of an encapsulation structure provided by some embodiments of the present disclosure.

As shown in FIG. 1, the present disclosure provides an encapsulation structure, which comprises a first barrier layer 1 and a second barrier layer 2. The first barrier layer 1 is located between an object to be encapsulated 4 and the second barrier layer 2. The first barrier layer 1 comprises a first leveling layer 12 configured to improve the leveling property of the surface of the second barrier layer 2 close to the first barrier layer 1 and a first water oxygen barrier layer 11 configured to improve the barrier capability to water and oxygen. The first water oxygen barrier layer 11 is located between the object to be encapsulated 4 and the first leveling layer 12, and the first leveling layer 12 is located between the first water oxygen barrier layer 11 and the second barrier layer 2.

In a practical implementation process, the object to be encapsulated 4 usually is a display device. The display device may be disposed in direct contact with the first water oxygen barrier layer 11. In some embodiments of the present disclosure, in order to further reduce the light wastage resulted by the first water oxygen barrier layer 11 through which the outgoing light of the display device passes, a flat protection layer is disposed between the display device and the first water oxygen barrier layer 11 to improve the leveling effect of a contact surface between the first water oxygen barrier layer 11 and the display device, and the light extraction efficiency of the outgoing light of the display device passing through the encapsulation structure is sufficiently ensured.

It can be seen from the above practical implementation process that, in the encapsulation structure provided by some embodiments of the present disclosure, the first barrier layer 1 and the second barrier layer 2 are disposed to effectively prevent the outside moisture and oxygen entering into the object to be encapsulated 4 and to prevent the object to be encapsulated 4 from being oxidized, so that the service life of the display apparatus is prolonged. Considering a poor leveling effect of the contact surface between the first barrier layer 1 and the second barrier layer 2 which directly contact with each other, the first barrier layer 1 is provided to comprise the first water oxygen barrier layer 11 and the first leveling layer 12. Then the problem of the contact surface having a poor leveling effect resulted by the direct contact between the second barrier layer 2 and the first water oxygen barrier layer 11 is avoided by disposing the first leveling layer 12 between the first water oxygen barrier layer 11 and the second barrier layer 2, so that the above contact surface possesses a better leveling property, then the light extraction efficiency of the outgoing light of the display device passing through the encapsulation structure is improved and the display effect of the display apparatus is improved.

The term of leveling refers to the planarization degree of the formed film surface. The leveling effect in the above embodiments can be understood as the planarization degree of the contact surface formed by the contact between the surface of the second barrier layer 2 and the surface of the first barrier layer 1.

Exemplarily, the first water oxygen barrier layer 11 is a layer having a strong water oxygen capability, and may be, for example, an aluminum oxide film layer or a silicon nitride film layer. When the first water oxygen barrier layer 11 is a silicon nitride film layer, the first water oxygen barrier layer 11 has characteristics of high hardness and strong water oxygen barrier capability. The first leveling layer 12 is a layer with good leveling effects, and may be a silicon oxynitride film layer, making the second barrier layer 2 with characteristics of good leveling effect and high light transmittance after the film being formed. Therefore, not only the water oxygen barrier capability of the encapsulation structure is satisfied, but also the light extraction efficiency of the outgoing light of the display device passing through the encapsulation structure is ensured, by arranging the silicon nitride film layer and the silicon oxynitride film layer together.

In addition, a thickness of the first water oxygen barrier layer 11 may be 600 nm-700 nm. In an embodiment, the thickness of the first water oxygen barrier layer 11 is 600 nm. In another embodiment, the thickness of the first water oxygen barrier layer 11 is 650 nm. In still another embodiment, the thickness of the first water oxygen barrier layer 11 is 700 nm.

A thickness of the first leveling layer 12 is 50 nm-800 nm. In an embodiment, the thickness of the first leveling layer 12 is 50 nm. In another embodiment, the thickness of the first leveling layer 12 is 200 nm. In still another embodiment, the thickness of the first leveling layer 12 is 800 nm.

A thickness of the second barrier layer 2 is 3 μm-10 μm. In an embodiment, the thickness of the second barrier layer 2 is 3 μm. In another embodiment, the thickness of the second barrier layer 2 is 5 μm. In still another embodiment, the thickness of the second barrier layer 2 is 10 μm.

The thickness of the first leveling layer 12 may be 100 nm-200 nm, so that the first leveling layer 12 can both satisfy the desired leveling effects of the second barrier layer 2 and has a good light transmittance. In an embodiment, the thickness of the first leveling layer 12 is 100 nm. In another embodiment, the thickness of the first leveling layer 12 is 150 nm. In still another embodiment, the thickness of the first leveling layer 12 is 200 nm. Wherein, the second barrier layer 2 can be formed via a method of inkjet printing.

The second barrier layer 2 has a barrier capability to water and oxygen, and may have effects of stress release and planarization. For example, the second barrier layer 2 may be an organic material layer, and the organic material layer may be an acrylate film layer or an epoxy film layer. For example, the moisture barrier capability of the silicon nitride film layer obtained by a method of plasma chemistry vapor deposition can be achieved to an order of magnitude of $10^{-5}$ g/(m$^2$·day), which can effectively prevent the moisture and oxygen entering into the display device. In some embodiments of the disclosure, the moisture barrier capability of the encapsulation structure is $10^{-5}$ g/(m$^2$·day). While the leveling property of an in-light surface of the organic material layer can be improved when a contact surface between the silicon nitride film layer obtained by a method of plasma chemistry vapor deposition and the organic material layer is formed, thus, the arrangement of the silicon nitride film layer and silicon oxynitride film layer not only satisfies the requirement of the encapsulation structure having higher water oxygen barrier capability, but also optimizes the planarization when the contact surface between the organic material layer and the silicon oxynitride film layer is formed.

Figure 2:
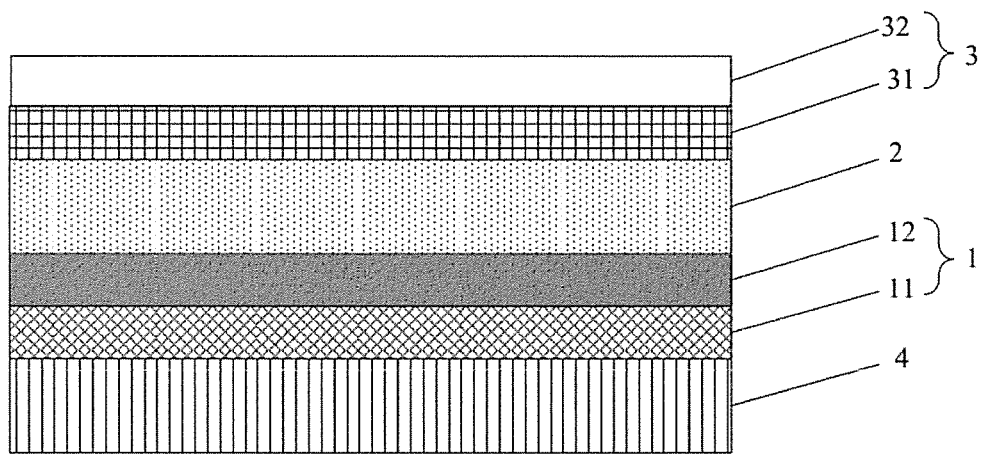
FIG. 2 is a second structural diagram of an encapsulation structure provided by some embodiments of the present disclosure.

In order to further improve the water oxygen barrier capability of the encapsulation structure, the encapsulation structure in some embodiments of the present disclosure may comprise a third barrier layer 3. The third barrier layer 3 is located on a surface of the second barrier layer 2 far away from the first barrier layer 1. The structure of the third barrier layer 3 is various, and two specific structural forms are exemplarily given below by referring to the figures:

The first structure form: as shown in FIG. 2, the third barrier layer 3 comprises a third leveling layer 31 configured to improve the leveling property of a surface of the second barrier layer 2 close to the third barrier layer 3 and a third water oxygen barrier layer 32 configured to improve the water/oxygen barrier capability, and the third leveling layer 31 is located between the second barrier layer 2 and the third water oxygen barrier layer 32.

Based on the structure of the third barrier layer 3, the leveling property of a contact surface between the second barrier layer 2 and the third barrier layer 3 is improved by arranging the third leveling layer 31 located on a surface of the second barrier layer 2 closing to third barrier layer 3, so that the light extraction efficiency of the outgoing light of the display device passing through the encapsulation structure is further improved. While the arrangement of the third water oxygen barrier layer 32 can improve the airtightness of the encapsulation structure, and prevent the moisture and oxygen at the contact surface between the encapsulation structure and the air immersing into the display device.

Figure 3:
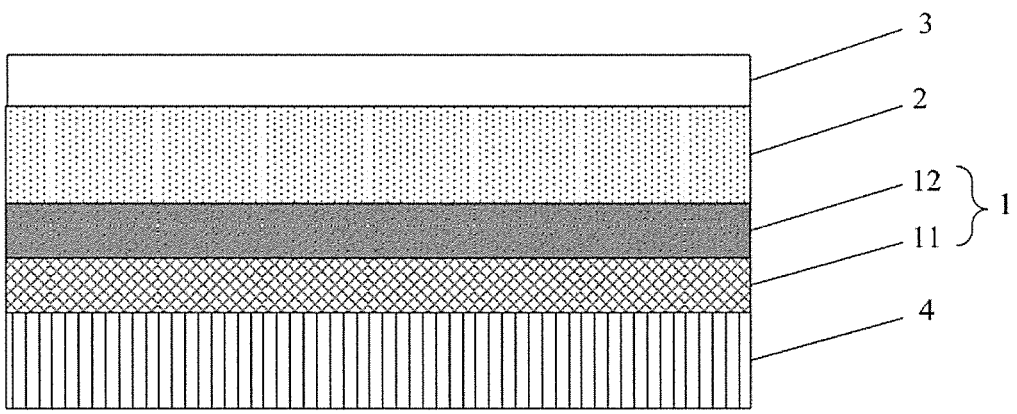
FIG. 3 is a third structural diagram of an encapsulation structure provided by some embodiments of the present disclosure.

The second structure form: as shown in FIG. 3, the third barrier layer 3 is located on a surface of the second barrier layer 2 far away from the first barrier layer 1. The third barrier layer 3 may be a third leveling layer 31 or a third water oxygen barrier layer 32. When the third barrier layer 3 is the third leveling layer 31, the third barrier layer 3 may be a silicon oxynitride film layer. And when the third barrier layer 3 is the third water oxygen barrier layer 32, the third barrier layer 3 may be a silicon nitride film layer.

The third barrier layer 3 is usually formed by choosing the second structure form in the practical production process. In order to ensure the encapsulation structure with good light extraction efficiency, the third barrier layer 3 can be the third leveling layer 31, i.e. the third barrier layer 3 is a silicon oxynitride film layer and a thickness of the third leveling layer 31 is 600 nm-800 nm. In an embodiment, the thickness of the third leveling layer 31 is 600 nm. In another embodiment, the thickness of the third leveling layer 31 is 700 nm. In still another embodiment, the thickness of the third leveling layer 31 is 800 nm. The third barrier layer 3 with this structure form does not arrange the third water oxygen barrier layer 32, so that the thickness of the encapsulation structure is further reduced, and the moisture barrier capability of the encapsulation structure in present disclosure can achieve to $10^{-5}$ g/(m$^2$·day). In some embodiments of the disclosure, the moisture barrier capability of the encapsulation structure is $10^{-5}$ g/(m$^2$·day). Therefore, a display apparatus adopting the above encapsulation structure not only satisfies the requirement of the display apparatus having strong water/oxygen barrier capability, but also makes the display apparatus more light weight. The third barrier layer also can be obtained by a method of plasma chemistry vapor deposition.

The refractive index of the first water oxygen barrier layer 11 is $n_1$, the refractive index of the first leveling layer 12 is $n_2$, the second barrier layer 2 is $n_3$, and $n_1 > n_2 > n_3$. The light emitted from the display device passes through the first water oxygen barrier layer 11 with the refractive index $n_1$, then passes through the first leveling layer 12 with the refractive index $n_2$, and finally passes through the second barrier layer 2 with the refractive index $n_3$. Because the refractive index of the $n_1$, $n_2$, $n_3$ decreases gradually, comparing with the encapsulation structure which does not arrange the first leveling layer 12 and in which the light emitted by the display device directly passes through the second barrier layer 2 after passing through the first water oxygen barrier layer 11, the total reflection wastage of the light is effectively reduced, thus, and the light extraction efficiency of the outgoing light of the display device passing through the encapsulation structure is improved.

Exemplarily, the refractive index of the first water oxygen barrier layer 11 is 1.85, the refractive index of the first leveling layer 12 is 1.55, and the refractive index of the second barrier layer 2 is 1.45-1.50. In an embodiment, the refractive index of the second barrier layer 2 is 1.45. In another embodiment, the refractive index of the second barrier layer 2 is 1.47. In still another embodiment, the refractive index of the second barrier layer 2 is 1.50. Based on this arrangement, the encapsulation structure has not only strong water/oxygen barrier capability but also better light transmittance.

Example 2

The example 2 of the present disclosure provides a display panel. The display panel comprises a display substrate and an encapsulation mentioned in the example 1. The display panel may be a flexible display panel.

Comparing with the prior art, the beneficial effects of the display panel provided by the example 2 of the present disclosure are the same as that of the encapsulation structure provided in above example 1, and it will not go into details herein.

Figure 4:
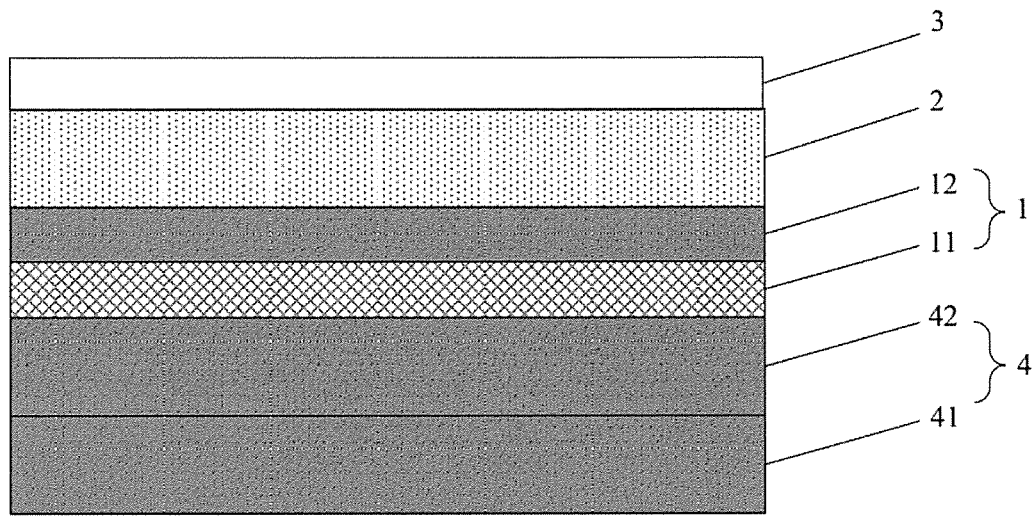
FIG. 4 is a structural diagram of a display panel provided by some embodiments of the present disclosure.

As shown in FIG. 4, the display panel comprises a first display film layer 41. The first display film layer 41 comprises a substrate, a moisture barrier layer, a buffer layer, a semiconductor layer, a gate insulating layer, a gate layer, an interlayer insulating layer, a source & drain layer, a passivation layer, an organic planarization layer, an anode layer and a pixel definition layer etc. A second display film layer 42, which comprises an organic light-emitting layer and a cathode layer, is formed on the first display film layer 41. Pluralities of thin film transistors of the first display film layer 41 are one to one or one-to-many corresponding to the pluralities of organic light-emitting devices of the second display film layer 42. A signal output end of each of the thin film transistors is connected to the corresponding light emitting device(s), and the encapsulation structure is formed on the surfaces of the pluralities of light-emitting devices far away from the pluralities of thin film transistors. Wherein the above thin film transistor comprises a gate located on the substrate, a gate insulating layer covered on the substrate and the gate, and an active layer, a source and a drain located over the gate insulating layer, wherein, the source and the drain are arranged in the same layer and not connected to each other. The specific structure of the display substrate will not be described again in the present example 2.

Figure 5:
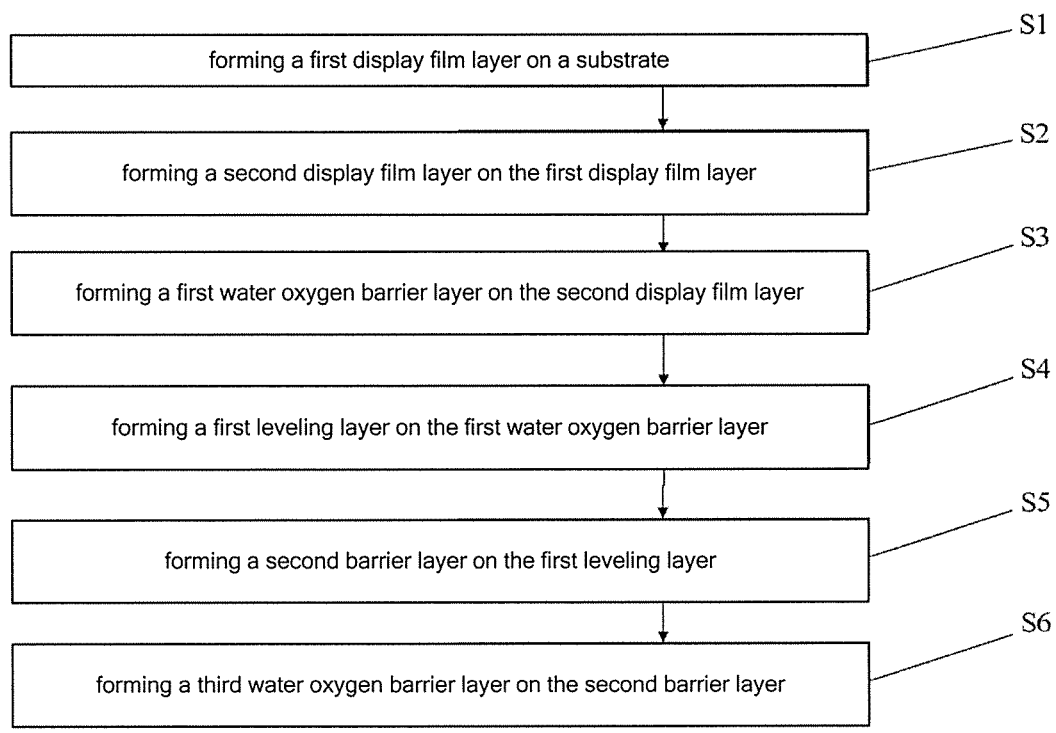
FIG. 5 is a flowchart of a forming method of the display panel provided by some embodiments of the present disclosure.

In addition, as shown in FIG. 5, the present example 2 also provides a method to produce the display panel. The method comprises the following steps.

S1: forming a first display film layer on a substrate; S2: forming a second display film layer on the first display film layer;

S3: forming a first water oxygen barrier layer on the second display film layer;

S4: forming a first leveling layer on the first water oxygen barrier layer;

S5: forming a second barrier layer on the first leveling layer;

S6: forming a third water oxygen barrier layer on the second barrier layer.

Example 3

The example 3 of the present disclosure provides a display apparatus. The display apparatus comprises the display panel mentioned in the example 2.

Comparing with the prior art, the beneficial effects of the display apparatus provided by the example 3 of the present disclosure are the same as that of the display panel provided by above example 2, and it will not go into details herein.

In the description of the above embodiments, the specific characteristics, structures, materials or features can be combined with a suitable method in any one or more embodiments or examples.

The foregoing is merely the specific embodiments of the present disclosure, but the protection scope of the present disclosure is not limited thereto. In the technical scope disclosed by the present disclosure, the modifications or replacements easily thought by anyone skilled in the art shall fall into the protection scope of the present disclosure. Therefore, the protection scope of the present disclosure should be subject to the protection scope of the claims.

What is claimed is:

1. An encapsulation structure applied to a display apparatus, comprising a first barrier layer, a second barrier layer, a third barrier layer and a flat protection layer, the first barrier layer being located between an object to be encapsulated and the second barrier layer, the third barrier layer being located on a surface of the second barrier layer far away from the first barrier layer, wherein,
   the first barrier layer comprises a first leveling layer and a first water oxygen barrier layer, the first water oxygen barrier layer is located between the object to be encapsulated and the first leveling layer, and the first leveling layer is located between the first water oxygen barrier layer and the second barrier layer;
   the third barrier layer comprises a third leveling layer and a third water oxygen barrier layer, the third leveling layer is located between the second barrier layer and the third water oxygen barrier layer, the third water oxygen barrier layer is directly located on the third leveling layer, and the third leveling layer is a silicon oxynitride film layer;
   the flat protection layer is located between the object to be encapsulated and the first water oxygen barrier layer to improve a leveling effect of a contact surface between the first water oxygen barrier layer and the object to be encapsulated;
   the first water oxygen barrier layer is an aluminum oxide film layer or a silicon nitride film layer; the first leveling layer is a silicon oxynitride film layer; the second barrier layer is an epoxy film layer;
   a planarization degree of a surface of the first leveling layer in contact with the second barrier layer is higher than a planarization degree of a surface of the first water oxygen barrier layer in contact with the second barrier layer when the first water oxygen barrier layer is in direct contact with the second barrier layer;
   a refractive index of the first water oxygen barrier layer is $n_1$, a refractive index of the first leveling layer is $n_2$, a refractive index of the second barrier layer is $n_3$, and $n_1 > n_2 > n_3$;
   the refractive index of the first water oxygen barrier layer is 1.85, the refractive index of the first leveling layer is 1.55, and the refractive index of the second barrier layer is 1.45-1.50;
   a thickness of the first water oxygen barrier layer is 600 nm-700 nm, a thickness of the first leveling layer is 200 nm-800 nm, a thickness of the second barrier layer is 3 μm-10 μm and a thickness of the third leveling layer is 700 nm-800 nm;
   the display apparatus is configured to emit light through the first water oxygen barrier layer, the first leveling layer, and the second barrier layer; and
   moisture barrier capability of the encapsulation structure is $10^{-5}$ g/(m$_2$.day).

2. A display panel, comprising a display substrate and the encapsulation structure of claim 1, wherein, an object to be encapsulated is performed as the display substrate;
   the display substrate comprises a substrate and a plurality of thin film transistors formed on the surface of the substrate, a plurality of organic light-emitting devices are formed on an array of the plurality of thin film transistors, and the plurality of thin film transistors are one to one corresponding to the plurality of organic light-emitting devices; wherein,
   a signal output end of each of the thin film transistors is connected with the corresponding light emitting device, and the encapsulation structure is formed on the surface of the plurality of light-emitting devices far away from the plurality of thin film transistors.

3. A display apparatus, comprising the display panel of claim 2.

* * * * *